United States Patent
Kang et al.

(10) Patent No.: US 8,460,632 B2
(45) Date of Patent: Jun. 11, 2013

(54) METHOD OF MANUFACTURING QUANTUM DOT

(75) Inventors: Jong Hyuk Kang, Suwon-si (KR); Junghan Shin, Yongin-si (KR); Jae Byung Park, Seoul (KR); Dong-Hoon Lee, Yangsan-si (KR); Minki Nam, Anseong-si (KR); Kookheon Char, Seoul (KR); Seonghoon Lee, Seoul (KR); WanKi Bae, Seoul (KR); Jaehoon Lim, Seoul (KR); Joohyun Jung, Seoul (KR)

(73) Assignees: Samsung Display Co., Ltd. (KR); SNU R&DB Foundation (KR)

( * ) Notice: Subject to any disclaimer, the term of this patent is extended or adjusted under 35 U.S.C. 154(b) by 422 days.

(21) Appl. No.: 12/907,743

(22) Filed: Oct. 19, 2010

(65) Prior Publication Data

US 2011/0227007 A1    Sep. 22, 2011

(51) Int. Cl.
*H01M 4/58* (2010.01)
(52) U.S. Cl.
USPC ........ 423/561.1; 423/299; 423/508; 423/511; 252/301.6 R; 252/301.6 S; 252/301.6 F; 977/813; 977/825
(58) Field of Classification Search
CPC ....................................................... B82Y 30/00
USPC ....... 423/299, 508, 511, 561.1; 252/301.6 R, 252/301.6 S, 301.6 F; 977/813, 825
See application file for complete search history.

(56) References Cited

U.S. PATENT DOCUMENTS

2010/0140641 A1 *  6/2010  Kinomoto et al. .............. 257/98

FOREIGN PATENT DOCUMENTS

JP    2012-144587    *   8/2012

OTHER PUBLICATIONS

Li, L. et al., "One-pot Synthesis of Highly Luminescent InP/ZnS Nanocrystals without Precursor Injection", J. Am. Chem. Soc., 2008, 130 (35), pp. 11588-11589.
Peng, X. et al., "Colloidal InP Nanocrystals as Efficient Emitters Covering Blue to Near-Infrared", J. Am. Chem. Soc., 2007, vol. 129, No. 50, pp. 15432-15433.

* cited by examiner

*Primary Examiner* — Mark Kopec
*Assistant Examiner* — Haidung Nguyen
(74) *Attorney, Agent, or Firm* — Cantor Colburn LLP

(57) ABSTRACT

A method of manufacturing a quantum dot, the method including: mixing of a Group II precursor and a Group III precursor in a solvent to prepare a first mixture; heating the first mixture at a temperature of about 200° C. to about 350° C.; adding a Group V precursor and a Group VI precursor to the first mixture while maintaining the first mixture at the temperature of about 200° C. to about 350° C. to prepare a second mixture; and maintaining the second mixture at the temperature of about 200° C. to about 350° C. to form a quantum dot.

17 Claims, 5 Drawing Sheets

METHOD OF MANUFACTURING QUANTUM DOT

This application claims priority to Korean Patent Application No. 10-2010-0025434, filed on Mar. 22, 2010, and all the benefits accruing therefrom under 35 U.S.C. §119, the content of which in its entirety is herein incorporated by reference.

BACKGROUND OF THE INVENTION

1. Field of the Invention

The present disclosure relates to a method of manufacturing a quantum dot.

2. Description of the Related Art

A quantum dot is a semiconductor nanocrystal having a size of few nanometers. In general, the term quantum dot refers to a structure in which a shell is provided on a spherical core, and a quantum dot may provide improved light emitting properties. The band gap of the quantum dot can be easily selected. Thus the optical and electrical characteristics of the quantum dot can be selected by controlling the band gap between energy levels of the core and the shell. Thus a quantum dot may provide superior color purity and photonic and thermal stability relative to an organic material. The quantum dot can be prepared to have a core having a spherical shape, a bar shape, or a rectangular shape. A single shell or multiple shells may be stacked on the core.

The optical characteristics of the quantum dot are based on the quantum confinement effect. According to the quantum confinement effect, the band gap of an element is increased when a size of the element is reduced to a level equal to or less than the intrinsic Bohr exciton radius. Therefore, when a wavelength of light incident on the quantum dot has an energy higher than the band gap energy, the quantum dot absorbs the light so that the quantum dot is in an excited state. Then, the quantum dot emits light having a specific wavelength and returns to a ground state. The light emitted from the quantum dot may have a wavelength corresponding to the band gap energy. The light emitting characteristics of the quantum dot can be selected by controlling the size and composition of the quantum dot, and thus the quantum dot has been extensively employed in various light emitting devices.

However, there remains a need for an improved method of manufacturing the quantum dot.

BRIEF SUMMARY OF THE INVENTION

Disclosed is a simplified method of manufacturing a quantum dot.

Disclosed is a method of manufacturing a quantum dot within a short period of time.

In an embodiment, a method of manufacturing a quantum dot includes mixing a Group II precursor and a Group III precursor in a solvent to prepare a first mixture; heating the first mixture at a temperature of about 200° C. to about 350° C.; adding a Group V precursor and a Group VI precursor to the first mixture while maintaining the first mixture at the temperature of about 200° C. to about 350° C. to prepare a second mixture; and maintaining the second mixture at the temperature of about 200° C. to about 350° C. to form a core and a shell of the quantum dot.

In an embodiment, the quantum dot includes a core and a shell. The core and the shell can be formed under an inert gas atmosphere or the air atmosphere. A Group II element of the Group II precursor may include at least one selected from the group consisting of zinc, cadmium, and mercury. The Group II precursor may include at least one selected from the group consisting of dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium oxide, cadmium carbonate, cadmium acetate dihydrate, cadmium acetylacetonate, cadmium fluoride, cadmium chloride, cadmium iodide, cadmium bromide, cadmium perchlorate, cadmium phosphide, cadmium nitrate, cadmium sulfate, cadmium carboxylate, mercury iodide, mercury bromide, mercury fluoride, mercury cyanide, mercury nitrate, mercury perchlorate, mercury sulfate, mercury oxide, mercury carbonate, and mercury carboxylate.

The Group III element of the Group III precursor may include at least one selected from the group consisting of aluminum, gallium, and indium. The Group III precursor may include at least one selected from the group consisting of aluminum phosphate, aluminum acetylacetonate, aluminum chloride, aluminum fluoride, aluminum oxide, aluminum nitrate, aluminum sulfate, gallium acetylacetonate, gallium chloride, gallium fluoride, gallium oxide, gallium nitrate, gallium sulfate, indium chloride, indium oxide, indium nitrate, indium sulfate, and indium carboxylate.

The Group V element of the Group V precursor may include at least one selected from the group consisting of nitrogen, phosphorus, and arsenic. The Group V precursor may include at least one selected from the group consisting of an alkyl phosphine, a tris(trialkylsilyl phosphine), a tris(dialkylamino phosphine), a tris(dialkylamino) phosphine, arsenic oxide, arsenic chloride, arsenic sulfate, arsenic bromide, arsenic iodide, nitric oxide, nitric acid, and ammonium nitrate. The alkyl phosphine may include at least one selected from the group consisting of triethyl phosphine, tributyl phosphine, trioctyl phosphine, triphenyl phosphine, and tricyclohexyl phosphine.

The Group VI element of the Group VI precursor may include at least one selected from the group consisting of sulfur, selenium, and tellurium. The Group VI precursor may include at least one selected from the group consisting of sulfur, an alkylthiol, a trialkylphosphine sulfide, a trialkenylphosphine sulfide, an alkylamino sulfide, an alkenylamino sulfide, a trialkylphosphine selenide, a trialkenylphosphine selenide, an alkylamino selenide, an alkenylamino selenide, a trialkylphosphine telluride, a trialkenylphosphine telluride, an alkylamino telluride, and an alkenylamino telluride. The alkylthiol may include at least one selected from the group consisting of hexane thiol, octane thiol, decane thiol, dodecane thiol, hexadecane thiol, and mercaptopropyl silane.

The Group II precursor may include zinc oleate, and the Group VI precursor may include trioctyl phosphine sulfide or tributyl phosphine sulfide.

The Group V precursor solution and the Group VI precursor solution may be simultaneously injected into the first mixture.

The Group V precursor solution and the Group VI precursor solution may be injected under an inert gas atmosphere or an air atmosphere.

The method may further include forming a core, and forming a shell.

In an embodiment, the core and the shell are each independently formed under the inert gas atmosphere or the air atmosphere.

The shell may include at least one selected from the group consisting of a Group II-VI compound and a Group II-III-VI compound. The shell may include ZnS or InZnS.

In an embodiment, the method of manufacturing the quantum dot can shorten the manufacturing time for the quantum dot by simultaneously forming the core and the shell in a single process. In addition, because some precursors are injected under the selected temperature condition, wide-range temperature adjustment may be avoided, providing a more stable synthesis reaction, thereby reducing consumption of raw material and improving yield.

BRIEF DESCRIPTION OF THE DRAWINGS

The above and other advantages will become readily apparent by reference to the following detailed description when considered in conjunction with the accompanying drawings wherein.

DETAILED DESCRIPTION OF THE INVENTION

Figure 1:
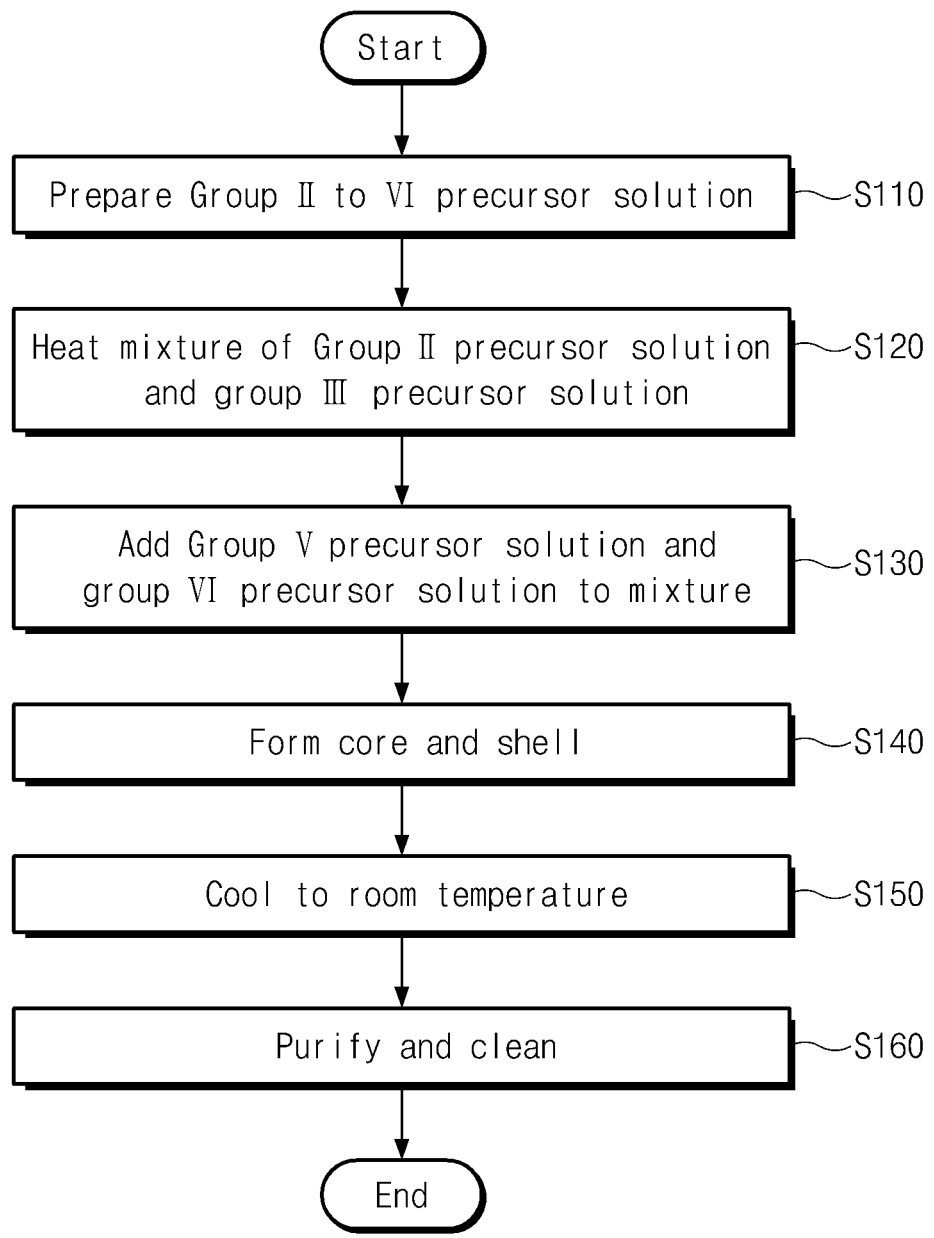
FIG. 1 is a flowchart showing an exemplary embodiment of a method of manufacturing a quantum dot.

Hereinafter, a method of manufacturing a quantum dot according to exemplary embodiments of the present invention will be described in further detail with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, unless provided otherwise, the term "Group" refers to a Group of the periodic table of the elements.

The general method of manufacturing the quantum dot includes combining a Group II precursor and a Group III precursor in a solvent to provide a first mixture. The Group II precursor and Group III precursor can be solid and added to the solvent simultaneously or sequentially, or one or both of the precursors can be pre-dissolved in a solution. The first mixture is heated at a temperature of about 200° C. to about 350° C. The Group V precursor and the Group VI precursor are added to the first mixture while maintaining the first mixture at the temperature of about 200° C. to about 350° C. to form the quantum dot by maintaining a second mixture at the temperature of about 200° C. to about 350° C. The Group V precursor and Group VI precursor can be solid and added to the solvent simultaneously or sequentially, or one or both of the precursors can be pre-dissolved in a solution. The quantum dot can have a core-shell structure. Then, the resulting mixture, which includes the quantum dot, is cooled into room temperature, and purification and cleaning processes are performed to obtain the quantum dot having high purity.

FIG. 1 is a flowchart schematically showing an exemplary embodiment of the method of manufacturing the quantum dot.

Referring to FIG. 1, the method of manufacturing the quantum dot includes preparing Groups II to VI precursor solutions (S110), adding the Group II precursor solution and the Group III precursor solution to a first mixture, heating the first mixture at the temperature of about 200° C. to about 350° C. (S120), adding the Group V precursor solution and the Group VI precursor solution to the first mixture while maintaining the first mixture at the temperature of about 200° C. to about 350° C. (S130), and forming a core and a shell of the quantum dot by maintaining a second mixture, which is obtained by adding the Group V precursor solution and the Group VI precursor solution into the first mixture, at the temperature of about 200° C. to about 350° C. (S140). Then, the resulting mixture, which includes the quantum dot, is cooled into room temperature (S150), and purification and cleaning processes are performed to obtain the quantum dot having high purity (S160).

Hereinafter, each step of the above process will be described in further detail.

First, the Groups II to VI precursor solutions are prepared by dispersing each of the Groups II to VI precursor solutions in an appropriate solvent, respectively (S110). The Group V and VI precursor solutions can be firstly prepared by dispersing the Group V and VI precursor solutions in the appropriate solvents or can be prepared just before the Group V and VI precursor solutions are injected into (e.g., added to) the first mixture.

The Group II element of the Group II precursor may include at least one of zinc, cadmium, and mercury.

The Group II precursor may include at least one selected from the group consisting of dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium oxide, cadmium carbonate, cadmium acetate dihydrate, cadmium acetylacetonate, cadmium fluoride, cadmium chloride, cadmium iodide, cadmium bromide, cadmium perchlorate, cadmium phosphide, cadmium nitrate, cadmium sulfate, cadmium carboxylate, mercury iodide, mercury bromide, mercury fluoride, mercury cyanide, mercury nitrate, mercury perchlorate, mercury sulfate, mercury oxide, mercury carbonate, mercury carboxylate, and precursor compounds based on the above precursors.

The Group III element of the Group III precursor may include at least one selected from the group consisting of aluminum, gallium, and indium.

The Group III precursor may include at least one selected from the group consisting of aluminum phosphate, aluminum acetylacetonate, aluminum chloride, aluminum fluoride, aluminum oxide, aluminum nitrate, aluminum sulfate, gallium acetylacetonate, gallium chloride, gallium fluoride, gallium oxide, gallium nitrate, gallium sulfate, indium chloride, indium oxide, indium nitrate, indium sulfate, indium carboxylate, and precursor compounds based on the above precursors.

The Group V element of the Group V precursor may include at least one selected from the group consisting of nitrogen, phosphorus, and arsenic.

The Group V precursor may include at least one selected from the group consisting of an alkyl phosphine, a tris(trialkylsilyl phosphine), a tris(dialkylamino phosphine), a tris(dialkylamino) phosphine, arsenic oxide, arsenic chloride, arsenic sulfate, arsenic bromide, arsenic iodide, nitric oxide, nitric acid, ammonium nitrate, and precursor compounds based on the above precursors.

The alkyl phosphine may include at least one selected from the group consisting of triethyl phosphine, tributyl phosphine, trioctyl phosphine, triphenyl phosphine, and tricyclohexyl phosphine.

The Group VI element of the Group VI precursor may include at least one selected from the group consisting of sulfur, selenium, and tellurium.

The Group VI precursor may include at least one selected from the group consisting of sulfur, an alkylthiol, a trialkylphosphine sulfide, a trialkenylphosphine sulfide, an alkylamino sulfide, an alkenylamino sulfide, a trialkylphosphine selenide, a trialkenylphosphine selenide, an alkylamino selenide, an alkenylamino selenide, a trialkylphosphine telluride, a trialkenylphosphine telluride, an alkylamino telluride, an alkenylamino telluride, and precursor compounds based on the above precursors. The alkylthiol may include at least one selected from the group consisting of hexane thiol, octane thiol, decane thiol, dodecane thiol, hexadecane thiol, and mercaptopropyl silane.

The Group VI precursor is contacted with the Group II precursor to form the shell of the quantum dot. The light emitting efficiency of the quantum dot may vary depending on the type and number of the precursors, and the emission wavelength of the quantum dot can be selected by varying the type of the Group VI precursor. For instance, if the sulfur precursor includes trioctyl phosphine sulfide, the wavelength may be lengthened by about 10 nm as compared with the sulfur precursor including tributyl phosphine sulfide.

Then, the Group II precursor solution is mixed with the Group III precursor solution, thereby preparing the first mixture.

The first mixture may next be added to the reactor and moisture and oxygen removed using an inert gas atmosphere or an air atmosphere. The inert gas may include nitrogen, which has relatively low reactivity as compared with other gases, as well as a noble gas, which is substantially inert. The moisture and oxygen can be substantially removed by heating the reactor at the temperature of about 100° C. to about 150° C., specifically about 110° C. to about 140° C., more specifically about 125° C., and then maintaining the reactor at the temperature of about 100° C. to about 150° C., specifically about 110° C. to about 140° C., more specifically about 125° C., under the nitrogen atmosphere or other inert gas atmosphere.

Unless indicated otherwise, the reaction is conducted under the inert gas atmosphere, specifically a nitrogen atmosphere.

After the moisture and oxygen have been substantially removed, air in the reactor is replaced with nitrogen. The reactor is heated until the internal temperature of the reactor reaches the temperature of about 200° C. to about 350° C., specifically about 225° C. to about 325° C., more specifically about 250° C. to about 300° C. (S120).

Then, the Group V precursor solution and the Group VI precursor solution are added to (e.g., injected into) the first mixture while maintaining the first mixture at the temperature of about 200° C. to about 350° C., specifically about 225° C.

to about 325° C., more specifically about 250° C. to about 300° C. (S130). The Group V precursor solution can be firstly mixed with the Group VI precursor solution and the mixture of the Group V precursor solution and the Group VI precursor solution may be added to (e.g., injected into) the first mixture. In addition, the Group V precursor solution and the Group VI precursor solution can be simultaneously poured into the first mixture. In an embodiment, the moisture and oxygen are substantially or effectively excluded from the reactor.

In an embodiment, the Group V precursor solution and the Group VI precursor solution are rapidly injected into the first mixture at substantially a same time. A mixture obtained by adding (e.g., injecting) the Group V precursor solution and the Group VI precursor solution into the first mixture is referred to as a second mixture. The temperature of the second mixture may be temporally reduced as the Group V precursor solution and the Group VI precursor solution are simultaneously injected into the first mixture. However, the temperature of the second mixture may not be significantly reduced, so that the temperature reduction may not substantially influence the reaction rate or result.

The mole ratio of the Group II precursor solution to the Group VI precursor solution in the second mixture may be about 10 to about 1, specifically about 1 to about 10, more specifically about 1 to about 1. For instance, when the zinc precursor is used as the Group II precursor and the sulfur precursor is used as the Group VI precursor, the mole ratio is about 1:1.

As the Group II precursor solution reacts with the Group VI precursor solution, the core and the shell of the quantum dot can be obtained from the second mixture (S140).

The core can be formed as the Group III element of the Group III precursor is combined with the Group V element of the Group V precursor, and the shell can be formed as the Group II element of the Group II precursor is combined with the Group III element of the Group III precursor and the Group VI element of the Group VI precursor. If the Group II element is Zn, the Group III element is In, the Group V element is P and the Group VI element is S, the quantum dot including the core of InP and the shell of InZnS and/or ZnS can be formed.

Then, the resulting mixture having the quantum dot is cooled to room temperature (S150), e.g., about 20° C., and then purified and cleaned to obtain the quantum dot having high purity (S160).

According to an embodiment, the quantum dot can be formed by using the Group II precursor including zinc oleate ("OA") (e.g., $Zn(OA)_2$), the Group III precursor including indium oleate ($In(OA)_2$), the Group V precursor including trimethylsilyl phosphine ("TMS") (e.g., $(TMS)_3P$), the Group VI precursor including tributyl phosphine sulfide ("TBPS"), and the solvent including 1-octadecene. According to another embodiment, trioctyl phosphine sulfide can be used as the Group VI precursor instead of TBPS.

In an embodiment, the first mixture includes the zinc oleate and the indium oleate, which are dispersed in the solvent (e.g., 1-octadecene) as expressed in Chemical formula 1.

Chemical formula 1

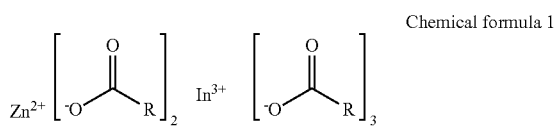

In Chemical formula 1, R is $—C_{17}H_{32}$.

Although the reaction may not occur between two precursors, the oxidation of the precursor may occur at the high temperature (e.g., 200° C. to 350° C.) if oxygen and moisture are present, thereby degrading the characteristics of the product. Accordingly, in an embodiment oxygen and moisture are removed from the reactor under the pressure of less than about 1 Torr, specifically less than about 0.5 Torr, more specifically about 200 millitorr (mTorr) or less, and at a temperature of about 20° C. to about 350° C., specifically 50° C. to about 200° C., more specifically about 120° C., for about 1 hour.

If trimethylsilyl phosphine and tributyl phosphine sulfide are simultaneously injected into the first mixture, trimethylsilyl phosphine may rapidly react with indium oleate as expressed in chemical formula 2. Thus, the core is substantially instantly formed (e.g., grown). The reaction to form the core may be performed within about 1 second to about 10 minutes, specifically about 1 minute to about 5 minutes, more specifically about 2 minutes after the injection of the trimethylsilyl phosphine and tributyl phosphine sulfide and then the tributyl phosphine sulfide may intervene in the reaction. In an embodiment, the core forming reaction may proceed without inclusion of zinc.

Chemical formula 2

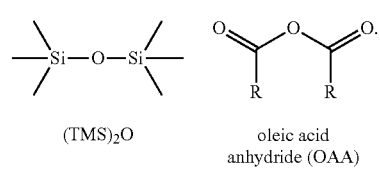

In Chemical formula 2, $(TMS)_2O$ represents trimethyl(trimethylsilyloxy)silane, and OAA represents oleic acid anhydride:

The core may be observed through the absorption spectrum of the product after the addition (e.g., injection) of the trimethylsilyl phosphine and tributyl phosphine sulfide. After the injection of the trimethylsilyl phosphine and tributyl phosphine sulfide, the color of the reaction solution is a yellow color to orange color at 300° C. In addition, a first exciton peak of the product has been observed from the absorption spectrum after about 2 minutes after the addition (e.g., injection) of the trimethylsilyl phosphine and tributyl phosphine sulfide. The first exciton peak represents the band gap of the quantum dot. In an embodiment, the first exciton peak has a maximum value at the wavelength of about 420 nanometers (nm) to about 480 nm, specifically about 430 nm to about 470 nm, more specifically about 450 nm to about 460 nm. The absorption characteristics of the product show that an InP quantum dot having a band gap greater than the band gap of the bulk InP (e.g., 1.34 eV, 919 nm) has been formed.

During the reaction to form the core, in further detail, after about 30 seconds have lapsed from the reaction to form the core, the shell is formed substantially simultaneously with the core. Because the growth of the shell may interrupt the growth of the core, the light emitting region of the core may be limited and an alloy of the core material and the shell material may be formed. In addition, during the reaction to form the shell, the shell may substantially prevent the precursor for the core from joining the core-forming reaction, and thus the core may have a substantially uniform size.

A precursor for forming the shell may include the indium precursor, the zinc precursor, and the sulfur precursor. In an embodiment, a competitive reaction may occur between the formation of In—S and Zn—S, which is caused by the indium precursor that is not joined the formation of the core. Specifically, the reaction between In and S is faster than the reaction between Zn and S, and the emission wavelength of the core depends predominantly on the amount of S.

The reaction to form the shell may be expressed as Chemical formula 3.

Chemical formula 3

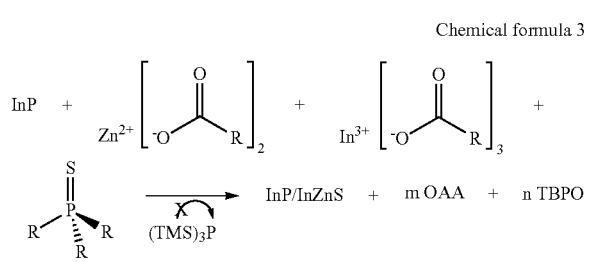

In Chemical formula 3, TBPO represents trioctylphosphine oxide:

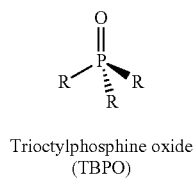

Trioctylphosphine oxide
(TBPO)

In the reaction shown in Chemical formula 3, when comparing an embodiment in which the amount of the sulfur precursor is increased while the concentration of the zinc precursor is fixed with an embodiment in which the amount of the zinc precursor is increased while the concentration of the sulfur precursor is fixed, the former shows greater variation in the central emission wavelength than that of the later. Because the reaction between In and S is faster than the reaction between Zn and S, it is estimated that the InZnS shell containing excessive In is initially grown about the core and then the Zn shell (e.g., Zn rich InZnS shell) is grown on the InZnS shell containing excessive In.

According to the method of manufacturing the quantum dot disclosed above, the quantum dot can be formed by instantly injecting the precursor while maintaining the temperature, and thus temperature control may be omitted when the precursor is injected. According to the related art, the speed of the reaction to form the core and the shell is selected by controlling the temperature, and reproducibility (e.g., quality) is degraded in terms of the emission wavelength and the color purity. In addition, according to the related art, temperature is desirably precisely controlled, making mass production difficult. The disclosed method solves the above and other problems.

In addition, according to the method of manufacturing the quantum dot disclosed above, through a sequential reaction of In—S formation after the formation of the core and simultaneous formation of Zn—S, the reaction may be diffusion-limited. In addition, because the shell is formed simultaneously with the core, Ostwald ripening can be substantially prevented or effectively eliminated and high color purity can be achieved.

As a result, the quantum dot representing green light, which has a FWHM of about 45 nm or less in the optical emission spectrum, can be synthesized with high reproducibility and improved quality.

Hereinafter, representative embodiments will be further disclosed in detail. It should be noted that the following embodiments are for illustrative purposes only and the present disclosure shall not be limited thereto.

Example 1

Manufacture of Indium Precursor Solution

After adding 4 millimoles (mmol) of indium acetate, 3.8 milliliters (mL, 12 mmol) of oleic acid and 1.2 mL of 1-octadecene to a reactor having a volume of 100 mL, the mixture is controlled for about one hour at a temperature of about 120° C. Then, 35 mL of 1-octadecene is added. The resulting indium oleate solution is stored at room temperature under a nitrogen atmosphere.

Example 2

Manufacture of Zinc Precursor Solution

After adding 4 mmol of zinc acetate, 2.6 mL (8 mmol) of oleic acid and 2.4 mL of 1-octadecene to the reactor having a volume of 100 mL, the mixture is controlled for about one hour at the temperature of about 120° C. Then, 35 mL of 1-octadecene is added. The resulting zinc oleate solution is stored at room temperature under a nitrogen atmosphere.

Example 3

Manufacture of Sulfur Precursor Solution

After adding 4 mmol of sulfur and 4 mmol of trioctyl phosphine to the reactor having a volume of 50 mL, the mixture is stirred at a temperature of about 150° C. under a nitrogen atmosphere until the sulfur is completely dissolved. Then, the mixture is cooled to the room temperature, and 1-octadecene is injected into the mixture until the trioctyl phosphine sulfide has concentration of 1 mmol/mL. The resulting sulfur trioctyl phosphine sulfide solution is stored at room temperature under a nitrogen atmosphere.

Example 4

Manufacture of Sulfur Precursor Solution

After adding 4 mmol of sulfur and 4 mmol of tributyl phosphine to the reactor having a volume of 50 mL, the mixture is stirred at a temperature of about 150° C. under a nitrogen atmosphere until the sulfur is completely dissolved. Then, the mixture is cooled to the room temperature, and 1-octadecene is injected into the mixture until the tributyl phosphine sulfide has concentration of 1 mmol/mL. The resulting tributyl phosphine sulfide solution is stored at the room temperature under the nitrogen atmosphere.

Example 5

Manufacture of Quantum Dot

After adding 4 mmol of indium oleate solution, 10 mL of zinc oleate solution and 1 mL of 1-octadecene to the reactor, the reactor is maintained for about one hour at a temperature of about 120° C. under a nitrogen atmosphere to remove moisture and oxygen. Then, the atmosphere in the reactor is replaced with nitrogen and heat is applied to the reactor under the nitrogen atmosphere until the reactor has the temperature of about 300° C.

Then, 0.6 mL of 1-octadecene is mixed with 1.0 mL (1.0 mmol) of tributyl phosphine sulfide, and 0.4 mL of trimethylsilyl phosphine solution (10 weight percent (wt %) in hexane, available from Strem Chemicals Inc.) is mixed with the mixture in a glove box.

Then, 6 mL of a mixture consisting of the tributyl phosphine sulfide solution and the trimethylsilyl phosphine solution is rapidly injected using a syringe while maintaining the reactor at a temperature of about 300° C. After the sulfur precursor solution and the indium precursor solution are injected, the reaction is carried out for 40 minutes while maintaining the above temperature.

After the reaction to form the core and shell is completed, the reactor is cooled to room temperature under the nitrogen atmosphere.

Then, acetone and ethanol are added to the resulting mixture in a ratio of about 10:1 and the resulting mixture is separated by a centrifugal separator operating at a speed of 4000 revolutions per minute (rpm), precipitating the quantum dot.

After removing the clear solution from the precipitate, chloroform (hexane or toluene is also appropriate) is added to the precipitate and the precipitate is dispersed again in the solvent.

The centrifugal separation and dispersion processes are repeated to obtain the quantum dot solution.

Example 6

Maximum Emission Wavelength and FWHM According to Concentration of Precursor

Figure 2:
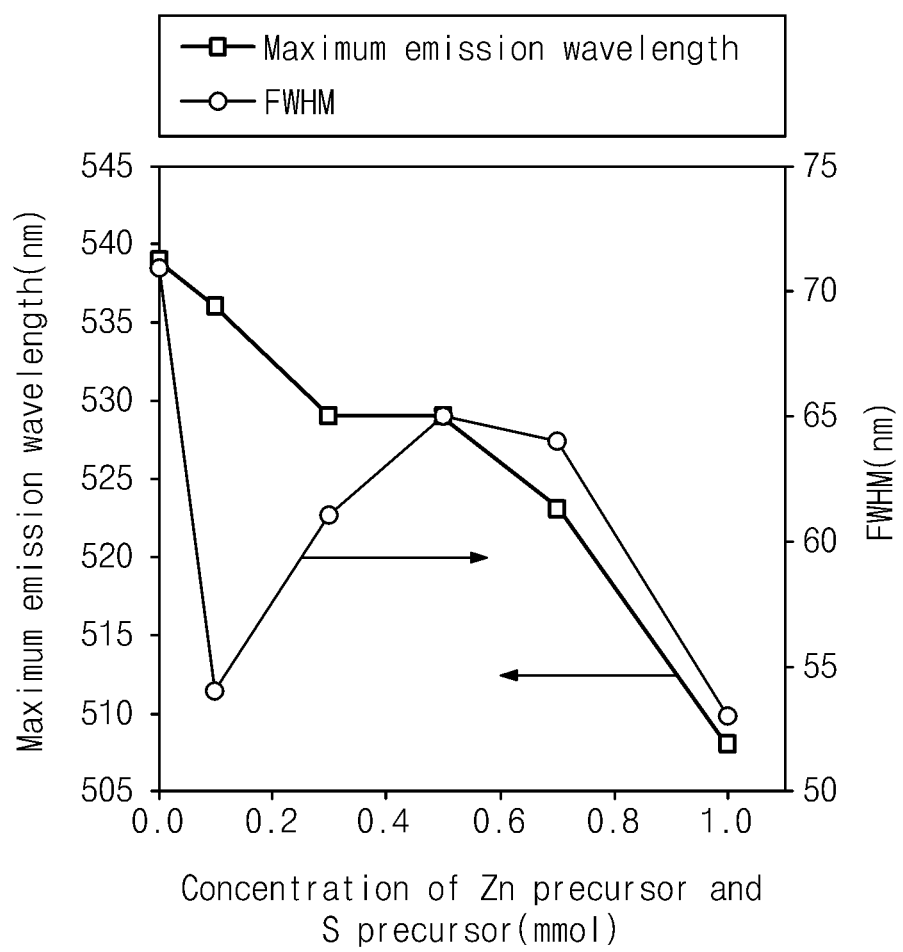
FIG. 2 is a graph of maximum emission wavelength (nanometers) and full width at half-maximum ("FWHM," nanometers) versus concentration of Zn precursor and S precursor (millimole, mmol) showing an FWHM (full width at half-maximum) and a maximum emission wavelength of a quantum dot when the quantum dot is manufactured while varying the concentration of a zinc oleate precursor solution and a trioctyl phosphine sulfide precursor solution according to Example 6.

FIG. 2 is a graph showing the FWHM (full width at half-maximum) and the maximum emission wavelength of the quantum dot when the quantum dot is manufactured as a function of the concentration of a zinc oleate precursor solution and a trioctyl phosphine sulfide precursor solution.

In this embodiment, the quantum dot is manufactured according to Examples 1-3 and 5. In further detail, the trioctyl phosphine sulfide precursor solution and the trimethylsilyl phosphine precursor solution are injected into the reactor while varying their concentration and maintaining the reactor at the temperature of about 300° C. In this Example, 0.1 mmol of the indium precursor and 0.1 mmol of the phosphorus precursor are injected, respectively.

Referring to FIG. 2, if the amount of zinc oleate precursor and trioctyl phosphine sulfide, which form the shell, is increased, the emission wavelength becomes shorter because the growth of the core is interrupted by the growth of the shell. That is, if the concentration of zinc oleate precursor and trioctyl phosphine sulfide, which form the shell, is increased, the shell may be rapidly formed, so that the growth of the core is interrupted.

Figure 3:
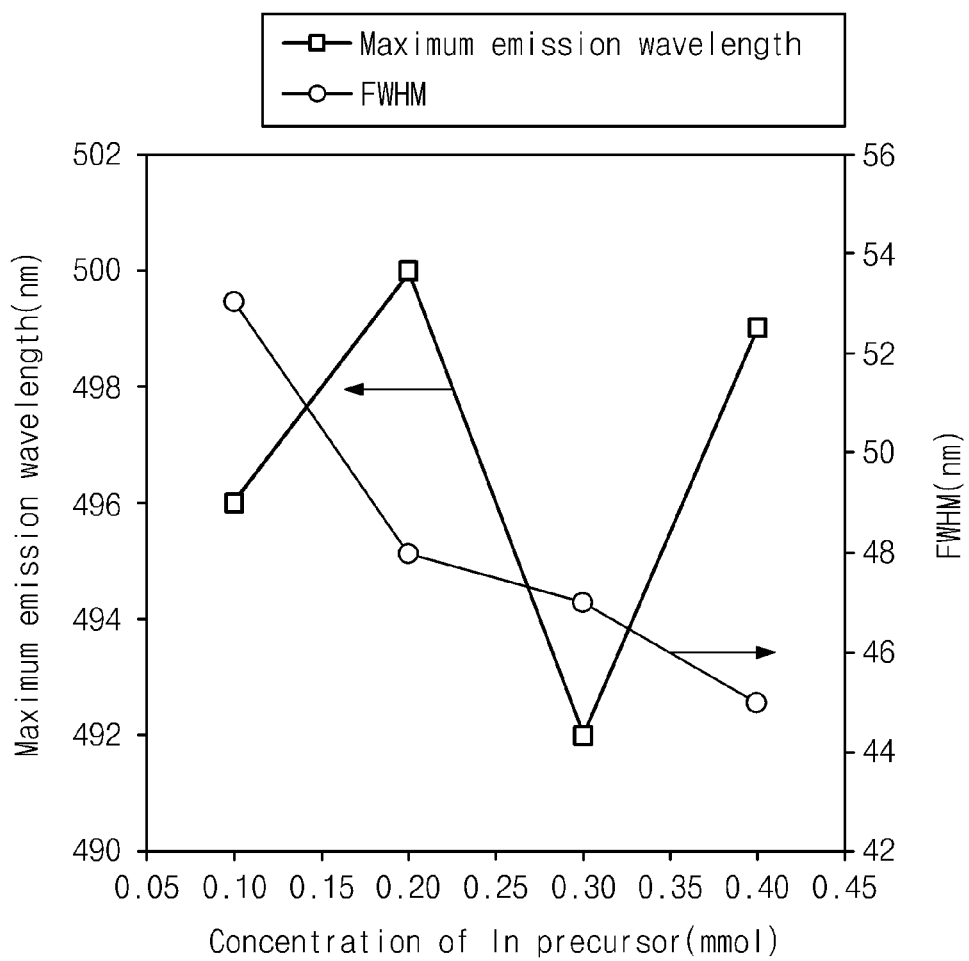
FIG. 3 is a graph of maximum emission wavelength (nanometers) and full width at half-maximum ("FWHM," nanometers) versus concentration (millimole, mmol) of In precursor showing an FWHM and a maximum emission wavelength of a quantum dot when the quantum dot is manufactured while varying concentration of indium oleate according to Example 6.

FIG. 3 is a graph showing the FWHM and the maximum emission wavelength of the quantum dot when the quantum dot is manufactured while varying concentration of indium oleate.

In this Example, the quantum dot is manufactured according to Examples 1, 2, 4, or 5. In further detail, indium oleate is injected into the reactor while varying their concentration and maintaining the reactor at the temperature of about 300° C. In this Example, 0.1 mmol of the phosphorus precursor, 1.0 mmol of the zinc precursor and 1.0 mmol of the sulfur precursor (tributyl phosphine sulfide) are injected, respectively.

Referring to FIG. 3, although the change in concentration of the indium precursor, which forms the core, rarely influences the emission wavelength, the change in concentration of the indium precursor influences the FWHM. That is, the core is formed and grown within a short period of time, and the growth of the shell, which depends on the precursor that forms the shell, is very low. The FWHM is reduced as the amount of the indium precursor is increased. That is, if the amount of the indium precursor is increased, the core can be instantly formed with high uniformity so that the core may have a uniform size.

Table 1 shows the FWHM and the light emitting efficiency according to the concentration of the precursors. In Table 1, the content of each precursor is expressed in millimoles, and the light emitting characteristics are measured from each quantum dot after excitation by light having the wavelength of 400 nm.

TABLE 1

| $In(OA)_3$ (mmol) | $TMS_3P$ (mmol) | $Zn(OA)_2$ (mmol) | TOPS (mmol) | Maximum emission wavelength ($\lambda$)/FWHM (nm) | light emitting efficiency (%) |
|---|---|---|---|---|---|
| 0.1 | 0.1 | 0.1 | 0.1 | 536/54 | 3.6 |
| 0.1 | 0.1 | 0.3 | 0.3 | 529/61 | 10.7 |
| 0.1 | 0.1 | 0.5 | 0.5 | 529/65 | — |
| 0.1 | 0.1 | 0.7 | 0.7 | 523/64 | — |
| 0.1 | 0.1 | 1.0 | 1.0 | 508/53 | 27.4 |

In Table 1, $In(OA)_3$ represents indium oleate, $TMS_3P$ represents trimethylsilyl phosphine, $Zn(OA)_2$ represents zinc oleate, and TOPS represents trioctyl phosphine sulfide.

Referring to Table 1, the quantum dot according to the Example represents higher light emitting efficiency as the amount of the zinc precursor and the sulfur precursor is increased. In addition, the light emitting efficiency is maximized when the amount of the zinc precursor and the sulfur precursor is 1 mmol, respectively. The reaction time is about 40 minutes or more.

The maximum emission wavelength of the quantum dot according to the embodiment is shifted into a shorter wavelength as the amount of the zinc precursor and the sulfur precursor, which form the shell, is increased. The highest light emitting efficiency can be achieved when the amount of the sulfur precursor and the zinc precursor is 1 mmol, respectively, regardless of the amount of the indium precursor.

Example 7

Figure 4:
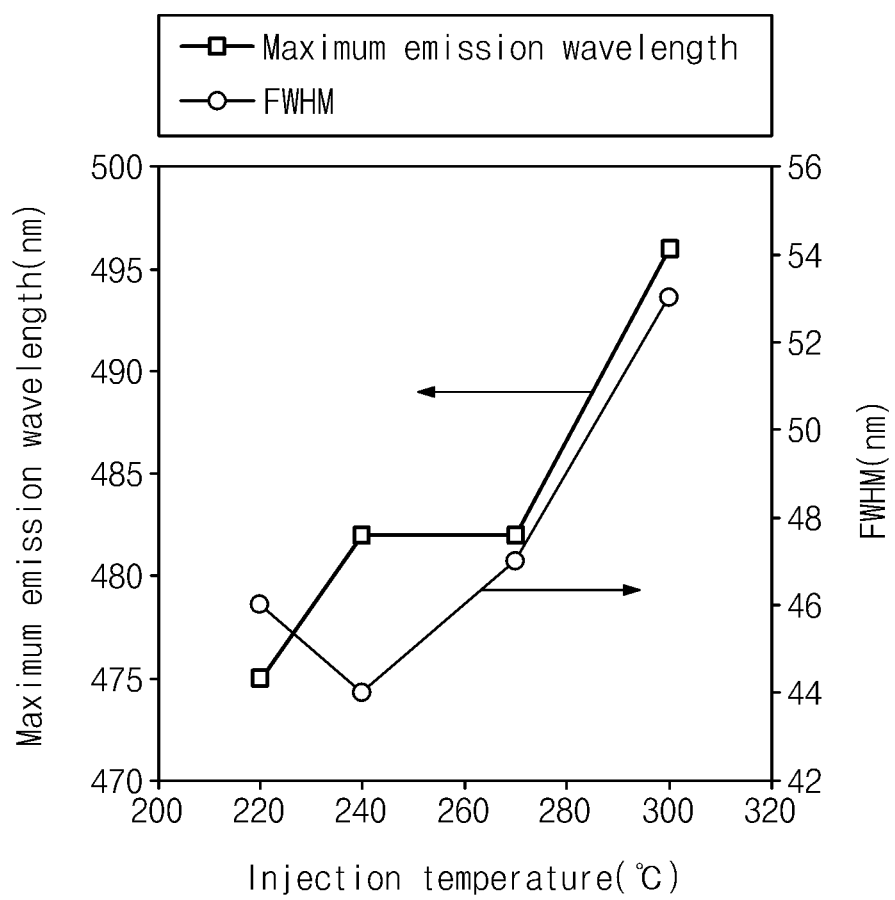
FIG. 4 is a graph of maximum emission wavelength (nanometers) and full width at half-maximum ("FWHM," nanometers) versus injection temperature (degrees centigrade, °C.) showing FWHM and maximum emission wavelength of a quantum dot according to the temperature of a reactor when a phosphorous precursor and a sulfur precursor are injected into the reactor according to Example 7.

Maximum Emission Wavelength and FWHM According to Injection Temperature of Precursor FIG. 4 is a graph showing the FWHM and the maximum emission wavelength of the quantum dot as a function of the temperature of the reactor when the phosphorus precursor and the sulfur precursor are injected into the reactor.

In this Example, the quantum dot is manufactured according to Examples 1, 2, 4, and 5. In further detail, the quantum dot is manufactured while varying the temperature of the reactor when the phosphorus precursor and the sulfur precursor are injected into the reactor. In addition, 0.1 mmol of the indium precursor, 0.1 mmol of the phosphorus precursor, 1.0 mmol of the zinc precursor, and 1.0 mmol of the sulfur precursor are injected, respectively.

Referring to FIG. 4, the quantum dot according to the present Example provides a narrow FWHM of 55 nm or less at the injection temperature of about 240° C. to about 300° C. In addition, the quantum dot provides the desirable wavelength characteristic of green light at the injection temperature of about 300° C. Thus, the quantum dot having the desirable green emission wavelength can be obtained if the phosphorus precursor and the sulfur precursor are injected at the injection temperature of about 300° C.

Figure 5:
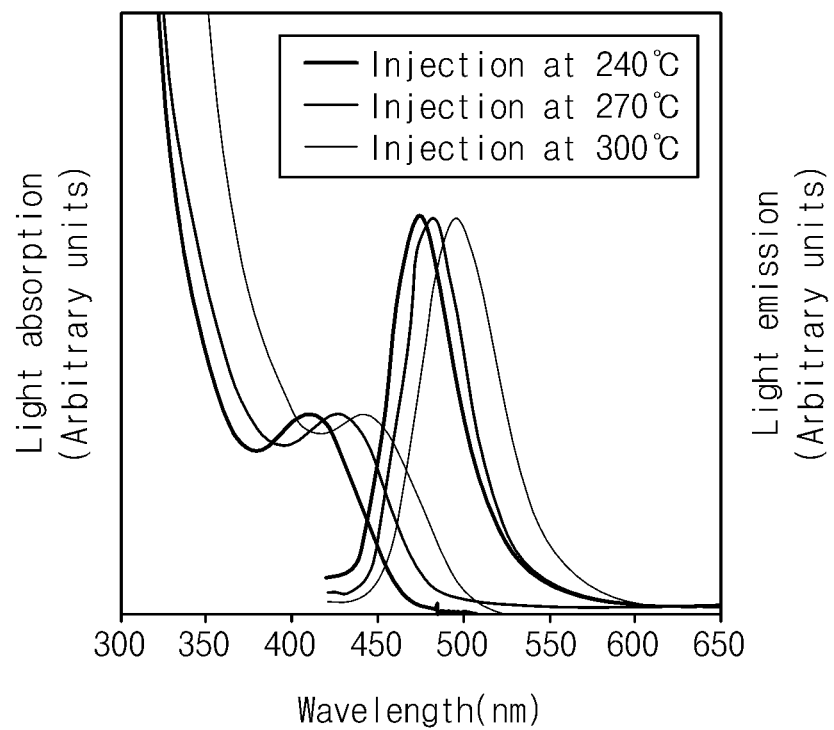
FIG. 5 is a graph of light absorption (arbitrary units) and light emission (arbitrary units) versus wavelength (nanometers, nm) showing an emission wavelength according to the temperature of a reactor when a phosphorus precursor and a sulfur precursor are injected into the reactor according to Example 7.

FIG. 5 is a graph showing the emission wavelength as a function of the temperature of the reactor when the phosphorus precursor and the sulfur precursor are injected into the reactor.

In this Example, the quantum dot is manufactured according to the Examples 1, 2, 4, and 5. In further detail, the quantum dot is manufactured while varying the temperature of the reactor when the phosphorus precursor and the sulfur precursor are injected into the reactor. In addition, 0.1 mmol of the indium precursor, 0.1 mmol of the phosphorus precursor, 1.0 mmol of the zinc precursor, and 1.0 mmol of the sulfur precursor are injected, respectively.

Referring to FIG. 5, the injection temperature and the growth temperature of the sulfur precursor and the phosphorus precursor are reduced while the amount of each precursor is fixed, and a blue shift occurs in the emission wavelength of the quantum dot. While not wanting to be bound by theory, it is understood that the blue shift occurs because the growth of the core is restricted due to the formation of the shell as the growth temperature of the precursor is reduced.

Although a representative embodiment of the present invention has been disclosed, it is understood that the present invention should not be limited to these embodiments but various changes and modifications can be made by one ordinary skilled in the art within the spirit and scope of the present invention as hereinafter claimed.

What is claimed is:

1. A method of manufacturing a quantum dot, the method comprising:
    mixing a Group II precursor and a Group III precursor in a solvent to prepare a first mixture;
    heating the first mixture at a temperature of about 200° C. to about 350° C.;
    adding a Group V precursor and a Group VI precursor to the first mixture while maintaining the first mixture at the temperature of about 200° C. to about 350° C. to prepare a second mixture; and
    maintaining the second mixture at the temperature of about 200° C. to about 350° C. to form the quantum dot.

2. The method of claim 1, wherein a Group II element of the Group II precursor is at least one selected from the group consisting of zinc, cadmium, and mercury.

3. The method of claim 2, wherein the Group II precursor comprises at least one selected from the group consisting of dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium oxide, cadmium carbonate, cadmium acetate dihydrate, cadmium acetylacetonate, cadmium fluoride, cadmium chloride, cadmium iodide, cadmium bromide, cadmium perchlorate, cadmium phosphide, cadmium nitrate, cadmium sulfate, cadmium carboxylate, mercury iodide, mercury bromide, mercury fluoride, mercury cyanide, mercury nitrate, mercury perchlorate, mercury sulfate, mercury oxide, mercury carbonate, and mercury carboxylate.

4. The method of claim 1, wherein a Group III element of the Group III precursor is at least one selected from the group consisting of aluminum, gallium, indium, and thallium.

5. The method of claim 4, wherein the Group III precursor comprises at least one selected from the group consisting of aluminum phosphate, aluminum acetylacetonate, aluminum chloride, aluminum fluoride, aluminum oxide, aluminum nitrate, aluminum sulfate, gallium acetylacetonate, gallium chloride, gallium fluoride, gallium oxide, gallium nitrate, gallium sulfate, indium chloride, indium oxide, indium nitrate, indium sulfate, and indium carboxylate.

6. The method of claim 1, wherein a Group V element of the Group V precursor is at least one selected from the group consisting of nitrogen, phosphorus, and arsenic.

7. The method of claim 6, wherein the Group V precursor comprises at least one selected from the group consisting of an alkyl phosphine, a tris(trialkylsilyl phosphine), a tris(dialkylamino phosphine), a tris(dialkylamino) phosphine, arsenic oxide, arsenic chloride, arsenic sulfate, arsenic bromide, arsenic iodide, nitric oxide, nitric acid, and ammonium nitrate.

8. The method of claim 7, wherein the alkyl phosphine comprises at least one selected from the group consisting of triethyl phosphine, tributyl phosphine, trioctyl phosphine, triphenyl phosphine, and tricyclohexyl phosphine.

9. The method of claim 1, wherein a Group VI element of the Group VI precursor is at least one selected from the group consisting of sulfur, selenium, and tellurium.

10. The method of claim 9, wherein the Group VI precursor comprises at least one selected from the group consisting of sulfur, an alkylthiol, a trialkylphosphine sulfide, a trialkenylphosphine sulfide, an alkylamino sulfide, an alkenylamino sulfide, a trialkylphosphine selenide, a trialkenylphosphine selenide, an alkylamino selenide, an alkenylamino selenide, a trialkylphosphine telluride, a trialkenylphosphine telluride, an alkylamino telluride, and an alkenylamino telluride.

11. The method of claim 1, wherein the Group II precursor comprises zinc oleate, and the Group VI precursor comprises trioctyl phosphine sulfide or tributyl phosphine sulfide.

12. The method of claim 1, wherein the Group V precursor solution and the Group VI precursor solution are simultaneously injected into the first mixture.

13. The method of claim 12, wherein the Group V precursor solution and the Group VI precursor solution are injected under an inert gas atmosphere or an air atmosphere.

14. The method of claim 13, wherein the quantum dot comprises a core and a shell.

15. The method of claim 14, wherein the core and the shell are each independently formed under the inert gas atmosphere or the air atmosphere.

16. The method of claim 14, wherein the shell comprises at least one selected from the group consisting of a group II-VI compound and a group II-III-VI compound.

17. The method of claim 16, wherein the shell comprises ZnS or InZnS.

* * * * *